(12) United States Patent
Ahn

(10) Patent No.: US 7,778,040 B2
(45) Date of Patent: Aug. 17, 2010

(54) PRINTED CIRCUIT BOARD ASSEMBLY

(75) Inventor: Seung-young Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 578 days.

(21) Appl. No.: 11/644,892

(22) Filed: Dec. 26, 2006

(65) Prior Publication Data

US 2007/0165389 A1    Jul. 19, 2007

(30) Foreign Application Priority Data

Jan. 16, 2006   (KR) ...................... 10-2006-0004580

(51) Int. Cl.
*H05K 7/10* (2006.01)

(52) U.S. Cl. ................... 361/767; 361/760; 361/748; 361/763; 361/766; 174/250; 174/253

(58) Field of Classification Search ................ 174/260, 174/261, 250, 253; 361/767, 760, 748, 761, 361/763, 766, 777, 778, 803, 821
See application file for complete search history.

(56) References Cited

U.S. PATENT DOCUMENTS

| | | | | |
|---|---|---|---|---|
| 4,947,144 A * | 8/1990 | Le Nohaic | ................. | 333/128 |
| 5,093,640 A | 3/1992 | Bischof | | |
| 5,448,208 A * | 9/1995 | Honjo | ........................ | 333/128 |
| 5,808,521 A | 9/1998 | Tosaka | | |
| 6,016,084 A | 1/2000 | Sugimoto | | |
| 6,137,389 A | 10/2000 | Uchikoba | | |
| 6,538,538 B2 | 3/2003 | Hreish et al. | | |
| 7,087,844 B2 * | 8/2006 | Ishimaru et al. | ............. | 174/250 |
| 7,405,634 B2 * | 7/2008 | Mobley et al. | ................. | 333/1 |
| 2003/0035275 A1 * | 2/2003 | Kopf | ......................... | 361/760 |
| 2005/0000729 A1 * | 1/2005 | Iljima et al. | ................. | 174/260 |
| 2005/0017827 A1 * | 1/2005 | Hsu | ........................... | 333/246 |

FOREIGN PATENT DOCUMENTS

| | | |
|---|---|---|
| CN | 1477923 | 2/2004 |
| JP | 7-106759 A | 4/1995 |
| JP | 7-249844 | 9/1995 |
| JP | 9-214076 | 8/1997 |
| JP | 2000-286512 | 10/2000 |

OTHER PUBLICATIONS

Office Action issued in corresponding Chinese Patent Application No. 2007100016724 dated Mar. 6, 2009.

* cited by examiner

*Primary Examiner*—Dameon E Levi
*Assistant Examiner*—Hoa C Nguyen
(74) *Attorney, Agent, or Firm*—Jefferson IP Law, LLP

(57) ABSTRACT

A printed circuit board assembly includes: a substrate; a main signal line formed on the substrate to transmit a signal; an SMD mounted on the substrate; a pad interposed between the SMD and the substrate; and a sub signal line provided on the substrate to electrically connect the main signal line with the pad, and having a width different from that of the main signal line. Thus, the printed circuit board assembly transmits a signal at a high speed and enhancing reliability and an economical efficiency of a product using the printed circuit board assembly.

19 Claims, 8 Drawing Sheets

PRINTED CIRCUIT BOARD ASSEMBLY

CROSS-REFERENCE TO RELATED APPLICATION

This application claims the benefit of Korean Application No. 2006-4580, filed Jan. 16, 2006 in the Korean Intellectual Property Office, the disclosure of which is incorporated herein by reference.

BACKGROUND OF THE INVENTION

1. Field of the Invention

Aspects of the present invention relates to a printed circuit board assembly, and more particularly, to a printed circuit board assembly enhancing the ability of transmitting a signal.

2. Description of the Related Art

Generally, a printed circuit board assembly includes a printed circuit board provided to an electric home appliance such as a digital TV, a computer or the like, and an advanced communication device, etc. The printed circuit board assembly is manufactured by forming a plurality of signal lines on a predetermined substrate, mounting a plurality of surface mounted devices (SMDs), and electrically connecting the signal lines therewith. Examples of the SMDs include an integrated circuit, a resistor, a connector, a capacitor or the like. The substrate is formed of a rigid material (such as epoxy resin, phenolic resin or the like) or a flexible material (such as polyimide or the like). The printed circuit board assembly may include multiple layers. The SMDs are mounted on the printed circuit board assembly by soldering, ball grid, pin or other mounting mechanisms.

FIG. 1A is a perspective view illustrating a conventional printed circuit board assembly. As shown in FIG. 1A, a conventional printed circuit board assembly includes a substrate 100, a signal line 111 formed on the substrate 100, an SMD 115 mounted on the substrate 100, and a pad 113 for mounting the SMD 115 on the substrate 100 to electrically connect the SMD 115 with the signal line 111. Here, the signal line 111 maintains an impedance of 50 ohm to prevent signal distortion. For example, in the case that a dielectric (not shown) forming the substrate 100 has a height of 0.1 mm, the signal line 111 has a width of approximately 0.18 mm. However, because of the size of the SMD 115, the pad 113 should have a relatively big width of 1.5 mm to electrically connect the SMD 115 with the signal line 111.

FIG. 1B is an equivalent circuit diagram of the conventional printed circuit board assembly. As shown in FIG. 1B, parasitic capacitance 131 refers to the parasitic capacitance which the pad 113 has to electrically connect the SMD 115 with the signal line 111 by soldering or the like. Capacitance 133 refers to the capacitance which the SMD 115 such as a capacitor has. A solid line arrow refers to a signal transmission direction, and a broken line arrow refers to a signal reflection direction.

In the conventional printed circuit board assembly shown in FIG. 1A, since the width of the pad 113 is bigger than that of the signal line 111, the parasitic capacitance 131 may be caused when a signal is transmitted from a transmitting terminal 120 to a receiving terminal 121. The parasitic capacitance 131 causes an impedance nonconformity of the signal line 111, and causes noise in the transmitting terminal 120, thereby complicating configuration and increasing cost. Also, the reflected signal causes noises in an adjacent signal line, and causes an electromagnetic interference (EMI). Especially, in the case that a high frequency signal is transmitted through the signal line 111, the parasitic capacitance 131 may cause a serious impedance nonconformity.

SUMMARY OF THE INVENTION

Accordingly, it is an aspect of the present invention to provide a printed circuit board assembly transmitting a signal at a high speed and enhancing reliability and an economical efficiency of a product using the printed circuit board assembly.

Additional aspects and/or advantages of the invention will be set forth in part in the description which follows and, in part, will be obvious from the description, or may be learned by practice of the invention.

The foregoing and/or other aspects of the present invention can be achieved by providing a printed circuit board assembly, comprising: a substrate; a main signal line formed on the substrate to transmit a signal; an SMD mounted on the substrate; a pad interposed between the SMD and the substrate; and a sub signal line provided on the substrate to electrically connect the main signal line with the pad, and having a width different from that of the main signal line.

According to the embodiment of the present invention, the width of the sub signal line is smaller than that of the main signal line.

According to the embodiment of the present invention, the main signal line and the sub signal line comprise a signal line transmitting a high frequency signal.

According to the embodiment of the present invention, the SMD comprises an AC coupling capacitor.

According to the embodiment of the present invention, the main signal line, the sub signal line and the SMD are disposed in the same plane of the substrate.

According to the embodiment of the present invention, the sub signal line is formed in a curved shape.

According to the embodiment of the present invention, the sub signal line is formed in a spiral shape.

The foregoing and/or other aspects of the present invention can be achieved by providing a printed circuit board assembly, comprising: a substrate provided with at least one layer; a SMD mounted on a first side of the layer of the substrate; a pad interposed between the SMD and the substrate; a main signal line provided on a second side of the layer of the substrate to transmit a signal; and a sub signal line electrically connecting the main signal line with the pad, and having a width different to that of the main signal line.

According to the embodiment of the present invention, the width of the sub signal line is smaller than that of the main signal line.

According to the embodiment of the present invention, the main signal line and the sub signal line are electrically connected by means of a via hole penetrated through the layer of the substrate.

According to the embodiment of the present invention, the main signal line and the sub signal line comprise a signal line transmitting a high frequency signal.

According to the embodiment of the present invention, the SMD comprises an AC coupling capacitor.

According to the embodiment of the present invention, the sub signal line is formed in a curved shape.

According to the embodiment of the present invention, the sub signal line is formed in a spiral shape.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
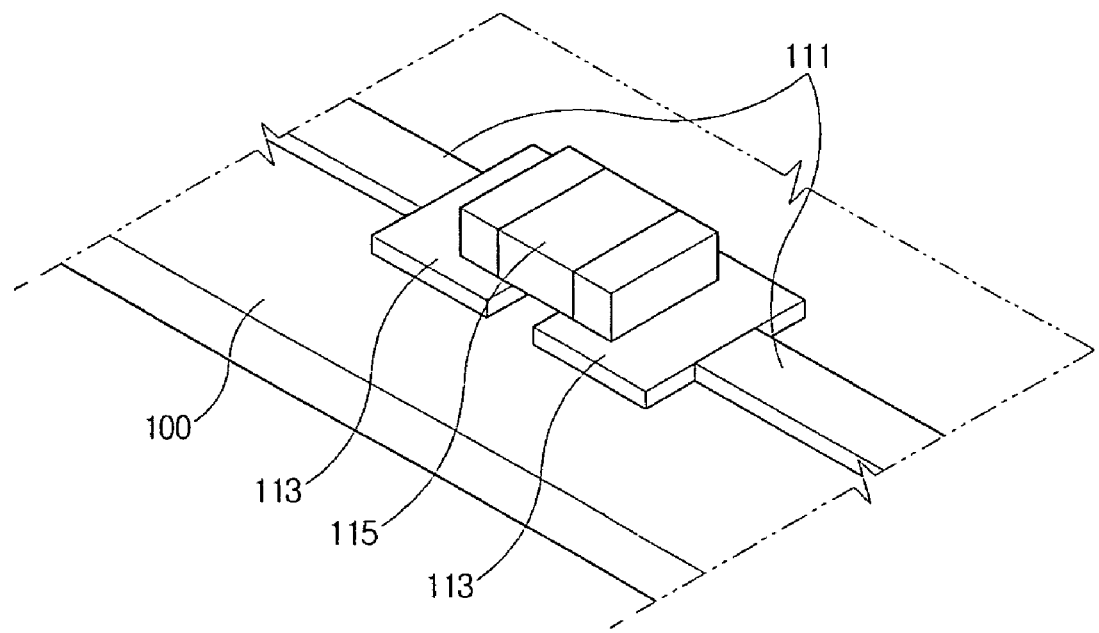
FIG. 1A is a perspective view illustrating a conventional printed circuit board assembly.
Figure 1B:
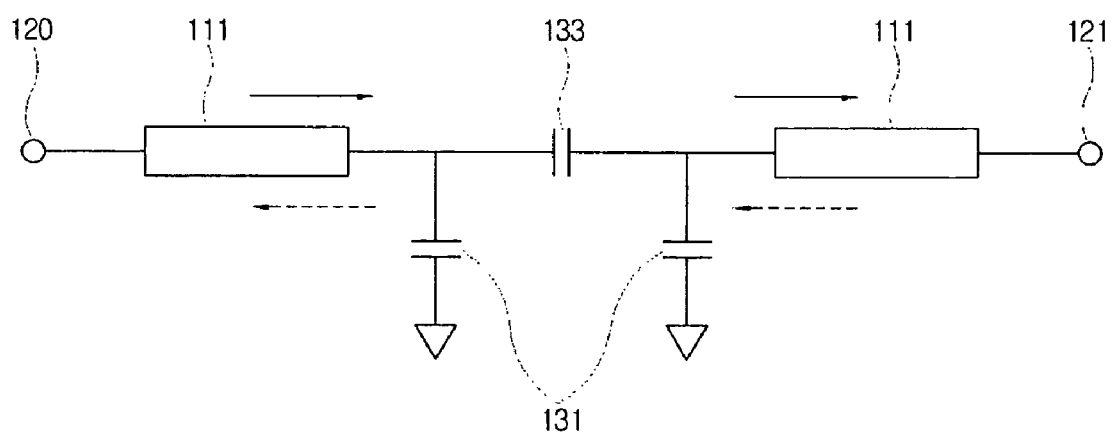
FIG. 1B is an equivalent circuit diagram of the printed circuit board assembly in FIG. 1A.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2A:
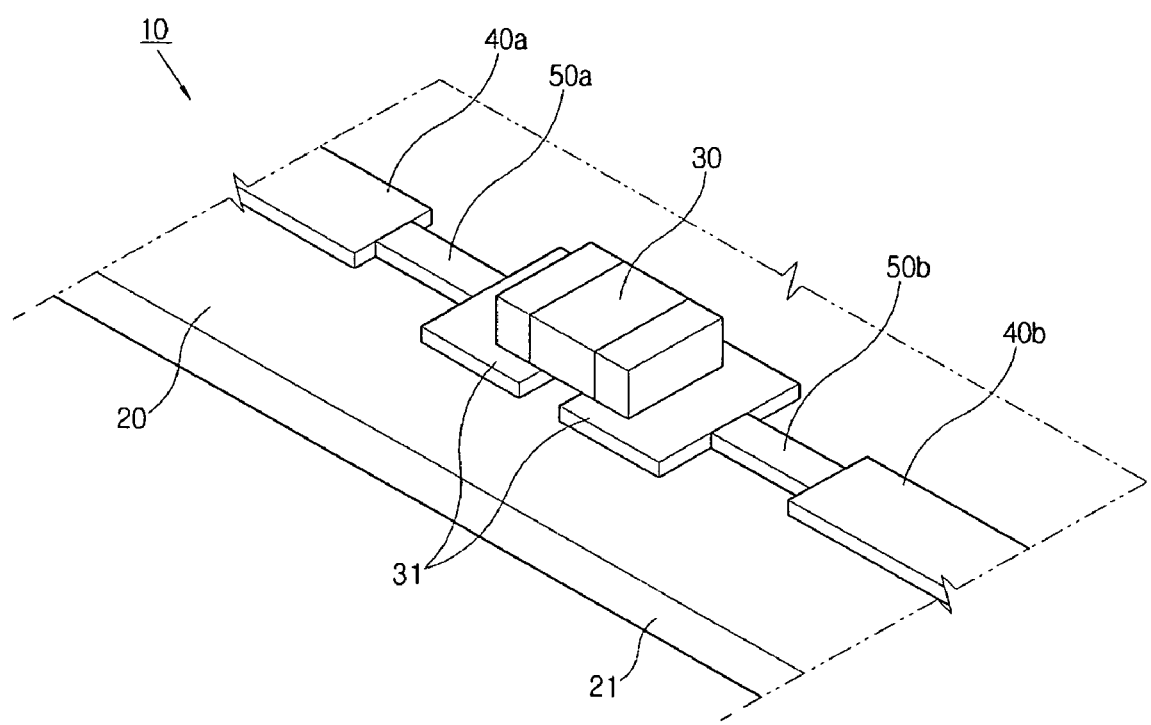
FIG. 2A is a perspective view illustrating a printed circuit board assembly according to an embodiment of the present invention.

As shown in FIG. 2A, a printed circuit board assembly 10 according to an embodiment of the present invention includes a substrate 20 provided with at least one layer 21. An SMD 30 is mounted on the substrate 20. A pad 31 is formed on the substrate 20 to be interposed between the SMD 30 and the substrate 20 and to be electrically connected with the SMD 30. Main signal lines 40a and 40b are provided on the substrate 20 to transmit a predetermined signal. Sub signal lines 50a and 50b are provided on the substrate 20 to electrically connect the main signal lines 40a and 40b with the pad 31. The sub signal lines 50a, 50b have widths different from those of the main signal lines 40a and 40b.

While not required in all aspects, the substrate 20 may have a plurality of layers 21 layered thereon. Various SMDs 30 may be mounted on the substrate 20 to be electrically connected with the main signal lines 40a and 40b and the sub signal lines 50a and 50b.

The layer 21 includes a conductive layer (not shown) forming the substrate 20 and transmitting a signal, and a dielectric (not shown) provided for forming the conductive layer. The conductive layer of the layer 21 is formed of the dielectric laminated with a copper clad to supply an electric power or transmit a signal. Here, the conductive layer may comprise the main signal lines 40a and 40b, the sub signal lines 50a and 50b, and the pad 31. The dielectric of the layer 21 is formed of phenolic resin, epoxy resin, or the like. In the case that the printed circuit board assembly 10 has multi layers 21, the respective conductive layers may be electrically connected with other conductive layers through the layers 21. Further, the materials of the conductive layer and the dielectric are not limited to the above. Moreover, the materials for the lines 40a, 40b, 50a, 50b, and/or the pad 31 need not be the same. Also, while the pad 31 is shown with two contacts, the pad 31 can have more or fewer contacts to the lines 50a and/or 50b in other aspects of the invention.

Figure 2B:
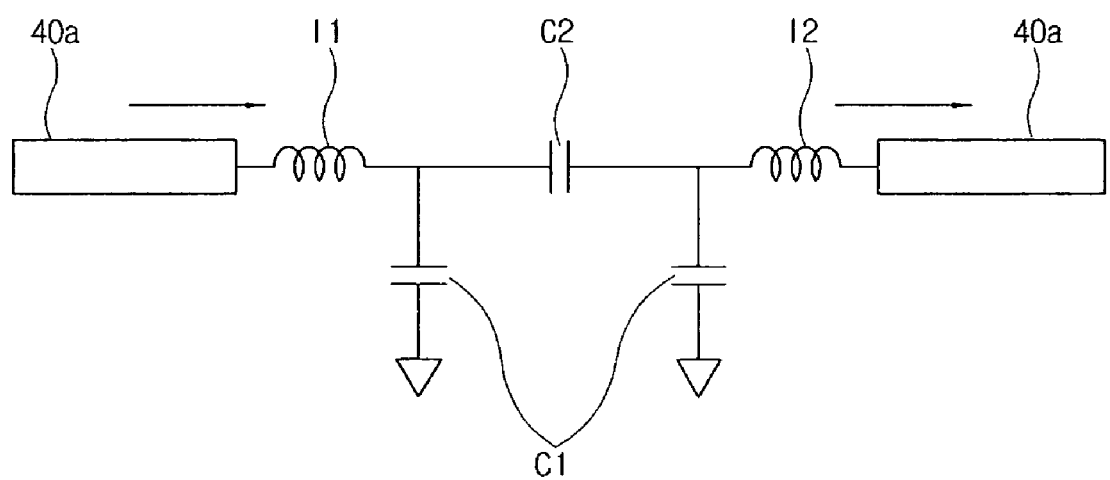
FIG. 2B is an equivalent circuit diagram of the printed circuit board assembly in FIG. 2A.

It is preferable, but not required, for the SMD 30 to be an AC coupling capacitor to transmit a high frequency signal and to block an unnecessary low frequency signal among various signals transmitted through the signal lines 40a, 40b, 50a and 50b. However, the SMD 30 may also comprise a resistor, a transistor, a condenser, an integrated circuit, or other like device usable with high and/or low frequency signals which is mounted on the substrate 20 to perform a predetermined function. The width of the shown SMD 30 is bigger than the widths of the signal lines 40a, 40b, 50a and 50b. Referring to FIG. 2B, the SMD 30 is electrically connected with the signal lines 40a, 40b, 50a and 50b through the pad 31 to have a predetermined capacitance C2.

The pad 31 is interposed between the substrate 20 and the SMD 30, and is electrically connected with the opposite sides of the SMD 30. The pad 31 electrically connects the sub signal lines 50a and 50b and the SMD 30 with substrate 20. The connection can be by of soldering or other mounting mechanism. It is preferable, but not required, for the width of the pad 31 to be bigger than that of the SMD 30 to mount the SMD 30. The width of the shown pad 31 is bigger than the widths of the signal lines 40a, 40b, 50a and 50b. Here, turning to FIG. 2B, the pad 31 has a predetermined parasitic capacitance C1. Thus, the parasitic capacitance C1 formed in the pad 31 may cause signal distortion, noises, an EMI, etc. The parasitic capacitance C1 can be offset by the inductances L1 and L2 of the sub signal lines 50a and 50b. While shown as bigger, it is understood that, if the width of the SMD 30 and/or the pad 31 is less than the width of the lines 40a, 40b, the width and/or cross section of the sub signal lines 50a, 50b can be suitably adjusted and/or widened in a similar manner to provide an offset to the parasitic capacitance C1.

The main signal lines 40a and 40b are formed on the substrate 20 to be electrically connected with the respective sub signal lines 50a and 50b to transmit a signal. While not required in all aspects, the main signal lines 40a and 40b have a predetermined width to transmit a signal having a predetermined frequency. The main signal lines 40a and 40b are electrically connected therewith by the pad 31 and the sub signal lines 50a and 50b. Here, it is preferable, but not required, for the widths of the sub signal lines 50a and 50b to be smaller than those of the main signal lines 40a and 40b. However, it is understood that the other properties of the cross sectional area (such as the thickness) of the sub signal lines 50a, 50b could be similarly reduced or enlarged relative to the cross sectional area (such as the thickness) of the lines 40a, 40b to provide the desired offset to the parasitic capacitance C1.

The shown sub signal lines 50a and 50b are formed on the substrate 20 to have widths smaller than those of the main signal lines 40a and 40b, and electrically connect the pad 31 with the respective main signal lines 40a and 40b. By way of example, the sub signal lines 50a and 50b are formed of a thin copper clad formed in a linear shape. Alternatively, the sub signal lines 50a and 50b may be formed in a spiral shape to maximize the length thereof, or in other curved shapes. Here, the shape, the length, the width, the thickness, etc. of the sub signal lines 50a and 50b may be determined according to properties and the widths of the main signal lines 40a and 40b, the width of the pad 31, etc. Also, it is preferable, but not required, for the main signal lines 40a and 40b and the sub signal lines 50a and 50b to be formed on the same plane as the layer 21 of the substrate 20 to minimize the impedance therebetween.

Referring to FIG. 2B, the sub signal lines 50a and 50b respectively have predetermined inductances L1 and L2. The inductances L1 and L2 of the sub signal lines 50a and 50b are changed according to the shape, the length, the width, etc. of the sub signal lines 50a and 50b. Accordingly, by changing the signal lines 50a, 50b, the parasitic capacitance C1 variously generated in the pad 31 can be efficiently offset. The inductances L1 and L2 of the sub signal lines 50a and 50b offset the capacitance C2 of the SMD 30 or the parasitic capacitance C1 of the pad 31. Thus, an impedance nonconformity of the main signal lines 40a and 40b can be minimized. The ability of transmitting a signal thereof can be enhanced, and a signal can be transmitted there through at a high speed. Also, since the printed circuit board assembly 10 has a simple configuration, the main signal lines 40a and 40b can be efficiently designed, and thereby enhancing an economical efficiency and reliability. Especially, the above effects can be maximized in the case that a high frequency signal is transmitted through the main signal lines 40a and 40b.

Hereinafter, a manufacturing process and a signal transmission process of the printed circuit board assembly 10 will be described by referring to FIGS. 2A and 2B. As shown in FIG. 2A, the main signal lines 40a and 40b are formed on the substrate 20. The SMD 30 is mounted on the substrate 20 to interpose the pad 31 therebetween. The sub signal lines 50a and 50b having widths smaller than those of the main signal lines 40a and 40b are formed on the substrate 20 to electrically connect the pad 31 and the main signal lines 40a and 40b.

As shown in FIG. 2B, if a signal having a predetermined frequency (especially a high frequency signal) is transmitted through the main signal lines 40a and 40b, the capacitance C2 is generated by the SMD 30 and the parasitic capacitance C1 is generated by the pad 31. Also, the inductances L1 and L2 are respectively generated to the sub signal lines 50a and 50b having widths smaller than those of the main signal lines 40a and 40b. Thus, the capacitances C1 and C2 of the pad 31 and the SMD 30 can be offset by the inductances L1 and L2 of the sub signal lines 50a and 50b, and to thereby reduce an impedance unconformity of the main signal lines 40a and 40b. Accordingly, noises and an EMI can be reduced according to the signal reflection in the main signal lines 40a and 40b. Accordingly, the printed circuit board assembly 10 can enhance the ability of transmitting a signal with the simple configuration, and thereby enhancing an economical efficiency and reliability of a product using the printed circuit board assembly.

Figure 3A:
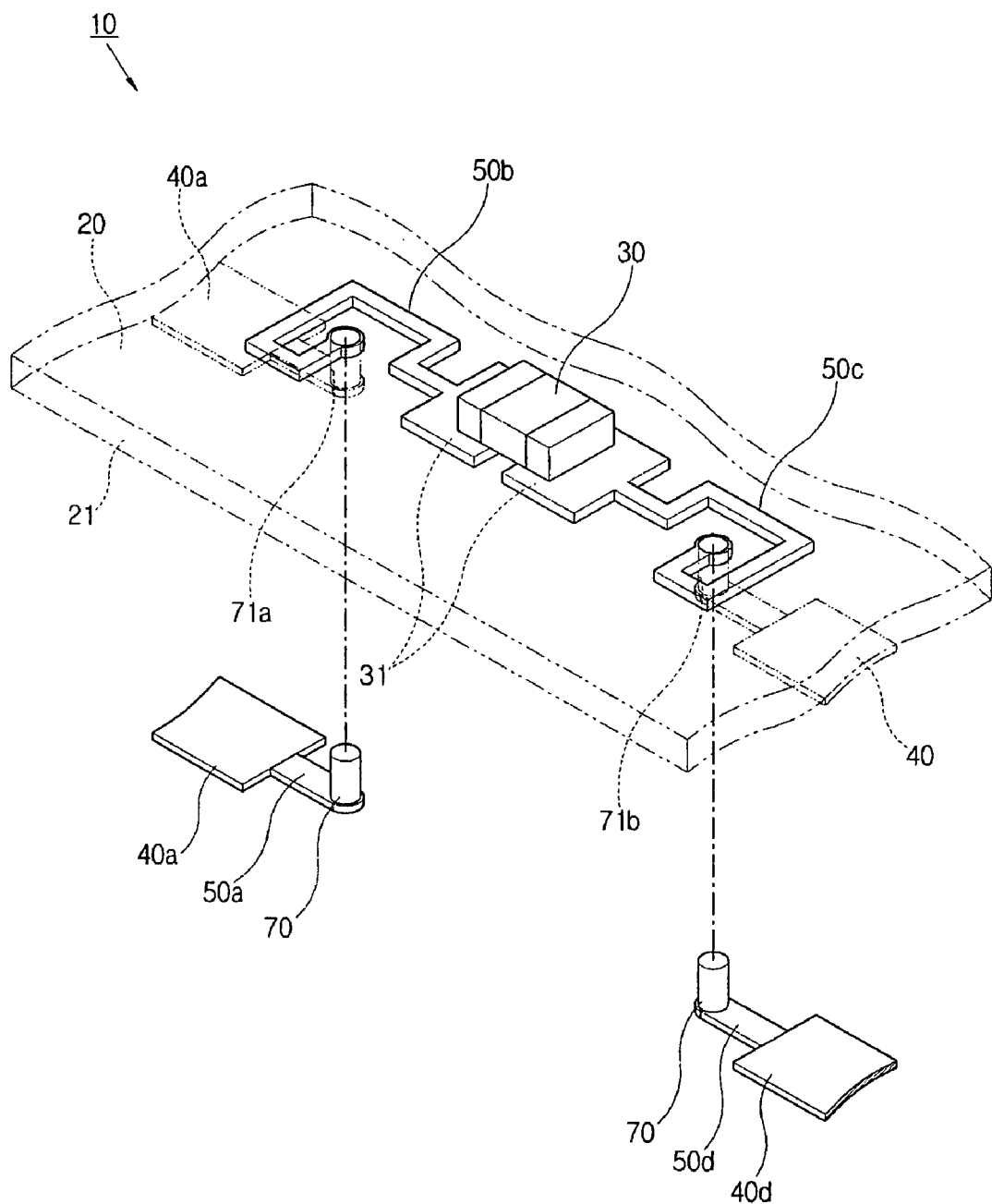
FIG. 3A is an exploded perspective view illustrating a printed circuit board assembly according to an embodiment of the present invention.
Figure 3B:
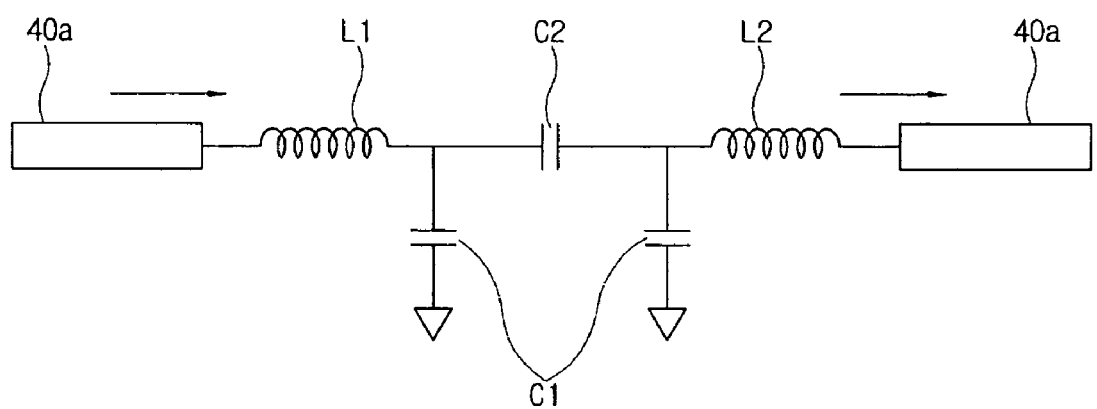
FIG. 3B is an equivalent circuit diagram of the printed circuit board assembly in FIG. 3A.

Hereinafter, a printed circuit board assembly 10 according to an embodiment of the present invention will be described by referring to FIGS. 3A and 3B. As shown in FIG. 3A, the printed circuit board assembly 10 includes a substrate 20 having at least one layer 21, a SMD 30 mounted on a first side of the layer 21, a pad 31 formed on the first side of the layer 21 to be interposed between the SMD 30 and the substrate 20, main signal lines 40a and 40b formed on a second side of the layer 21 to transmit a signal, and sub signal lines 50a, 50b, 50c and 50d electrically connecting the main signal lines 40a and 40b with the pad 31 and having widths different from those of the main signal lines 40a and 40b. It is preferable, but not required, for the main signal lines 40a and 40b and the sub signal lines 50a, 50b, 50c and 50d to be electrically connected by using holes 71a and 71b formed to be through the layer 21.

The main signal lines 40a and 40b are electrically connected with the sub signal lines 50a, 50b, 50c and 50d to interpose a dielectric (not shown) of the layer 21 therebetween through the via holes 71a and 71b. The sub signal lines 50a, 50b, 50c and 50d are formed in a spiral shape on the substrate 20 to increase the length thereof. However, it is understood that other shapes, such as zigzag shapes, can be utilized to adjust the length of the signal lines 50a, 50b, 50c, and/or 50d. Moreover, while shown as being on the same side, it is understood that the signal lines 40a, 40b do not have to be on a same side of the substrate 20, such as if one of the signal lines 40a, 40b is on one side and the other of the signal lines 40a, 40b is on the other side of the substrate 20.

A connector 70 electrically connects the signal lines 40a, 40b, 50a, 50b, 50c and 50d therewith through the via holes 71a and 71b. The via holes 71a and 71b penetrate through the layer 21 of the substrate 20. The shown printed circuit board assembly 10 includes the via holes 71a and 71b that penetrate through the dielectric of one layer 21. Alternatively, the printed circuit board assembly 10 may include via holes that penetrate through the plurality of layers 21.

The sub signal lines 50b and 50c are electrically connected with the pad 31 at an upper side of the layer 21, and the sub signal lines 50a and 50d are connected with the main signal lines 40a and 40b at a lower side of the layer 21. However, alternatively, the sub signal lines 50a, 50b, 50c and 50d may be formed in an upper side of the layer 21, and the main signal lines 40a and 40b may be formed in a lower side of the layer 21. Also, alternatively, the sub signal lines 50a, 50b, 50c and 50d may be formed in an upper side of the layer 21, and the main signal lines 40a and 40b may be formed in opposite sides of the layer 21. The signal lines 40a, 40b, 50a, 50b, 50c and 50d are preferably connected therewith by the via holes 71a and 71b, but alternatively, may be connected by other known means. The via holes 71a and 71b may penetrate through the plurality of layers 21.

Accordingly, although the main signal lines 40a and 40b and the sub signal lines 50a, 50b, 50c and 50d are formed in different layers 21, they can be electrically connected therewith, to thereby minimize signal distortion due to the SMD 30 and the pad 31.

Figure 4A:
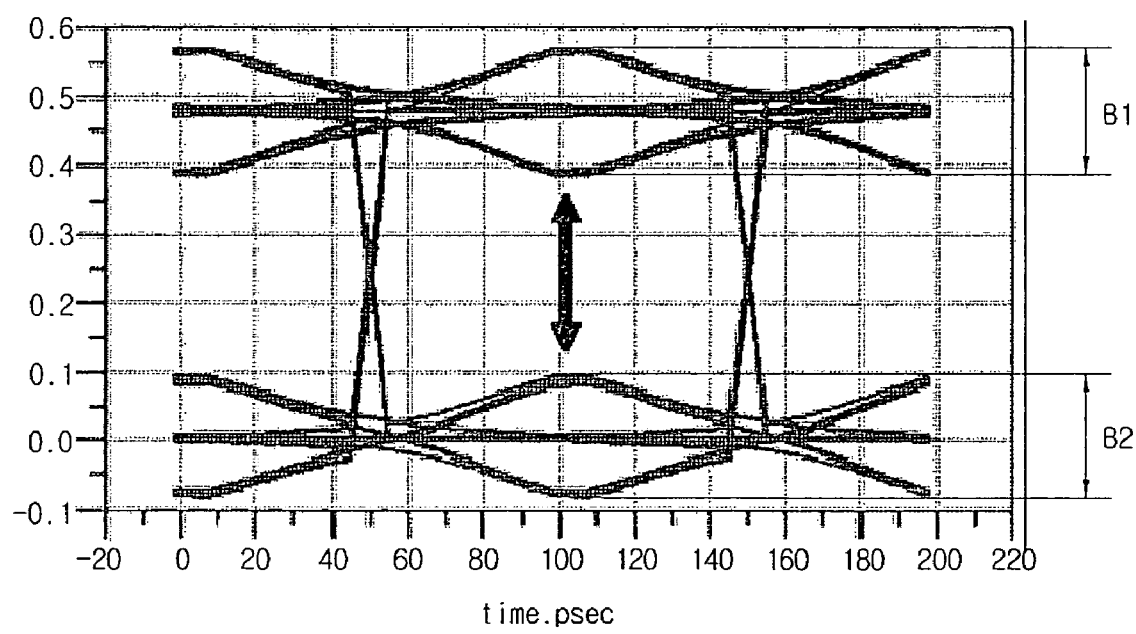
FIG. 4A is an eye diagram simulating variation of a signal pulse at a transmitting terminal in FIG. 1A.
Figure 4B:
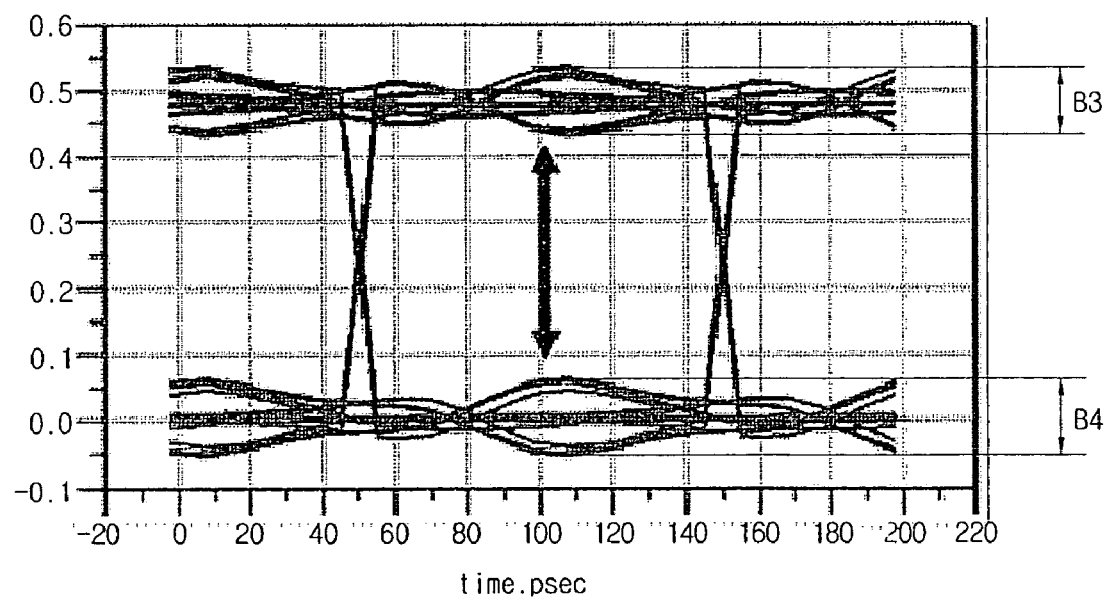
FIG. 4B is an eye diagram simulating variation of a signal pulse at a transmitting terminal of a printed circuit board assembly according to an aspect of the present invention.

FIG. 4A is an eye diagram simulating variation of a signal pulse having a predetermined frequency in a conventional transmitting terminal of a main signal line, and FIG. 4B is an eye diagram simulating variation of a signal pulse having a predetermined frequency in a transmitting terminal of a main signal line according to the present invention. Referring to FIG. 4A, variation ranges of the signal pulse in an upper part and a lower part are respectively B1 and B2, and referring to FIG. 4B, variation ranges of the signal pulse in an upper part and a lower part are respectively B3 and B4. Accordingly, the variation ranges B3, B4 of the printed circuit board assembly according to aspects of the present invention are smaller than the ranges of B1, B2 of the conventional printed circuit board assembly. That is, an interval between the upper part and the lower part of the printed circuit board assembly according to aspects of the present invention are bigger than that of the conventional printed circuit board assembly, and accordingly, the ability of transmitting a signal can be enhanced.

In the printed circuit board assembly according to aspects of the present invention, the inductance of the sub signal line having a width smaller than that of the main signal line offsets the parasitic capacitance of the pad, etc. Accordingly, an impedance unconformity of the signal lines can be prevented and signal distortion, noises, an EMI, etc. can be reduced, to thereby enhance the ability of transmitting a signal at a high speed. Also, the signal line can be efficiently designed with a simple configuration, thereby enhancing an economical efficiency and reliability of the product.

As described above, a printed circuit board assembly according to aspects of the present invention can enhance the ability of transmitting a signal at a high speed. Also, since a printed circuit board assembly according to the present invention has a simple configuration, a signal line can be efficiently designed, thereby enhancing an economical efficiency and reliability of the product.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A printed circuit board assembly, comprising:
a substrate;
a main signal line formed on the substrate to transmit a signal;
a surface mounted device (SMD) mounted on the substrate;
a pad interposed between and directly in contact with both the SMD and the substrate; and
a sub signal line provided on the substrate to electrically connect the main signal line with the pad, and having a width different from a width of the main signal line,
wherein the main signal line and the sub signal line comprise a signal line transmitting a high frequency signal and the SMD comprises an AC coupling capacitor.

2. The printed circuit board assembly according to claim 1, wherein the width of the sub signal line is smaller than the width of the main signal line.

3. The printed circuit board assembly according to claim 1, wherein the main signal line, the sub signal line and the SMD are disposed in a same plane of the substrate.

4. The printed circuit board assembly according to claim 3, wherein the sub signal line is formed in a curved shape.

5. The printed circuit board assembly according to claim 4, wherein the sub signal line is formed in a spiral shape.

6. The printed circuit board assembly according to claim 1, wherein:
the substrate is provided with at least one layer;
the SMD is mounted on a first side of the layer of the substrate;
the pad is mounted on the first side between the SMD and the substrate; and
the main signal line is provided on a second side of the layer of the substrate to transmit a signal.

7. The printed circuit board assembly according to claim 6, wherein the width of the sub signal line is smaller than the width of the main signal line.

8. The printed circuit board assembly according to claim 6, wherein the main signal line and the sub signal line are electrically connected through a via hole that penetrates through the layer of the substrate.

9. The printed circuit board assembly according to claim 8, wherein the sub signal line is formed in a curved shape.

10. The printed circuit board assembly according to claim 9, wherein the sub signal line is formed in a spiral shape.

11. A printed circuit board assembly for use with a surface mounted device (SMD), comprising:
a substrate;
a pad on the substrate and on which the SMD is mountable, the pad being and directly in contact with both the substrate and the SMD;
a main signal line on the substrate and having a parasitic capacitance when a signal is transmitted between the main signal line and the pad; and
a sub signal line connecting the main signal line and the pad and through which the signal passes between the main signal line and the pad, the sub signal line being shaped to produce an inductance to offset the parasitic capacitance during transmission of the signal,
wherein the main signal line and the sub signal line comprise a signal line transmitting a high frequency signal and the SMD comprises an AC coupling capacitor.

12. The printed circuit board assembly of claim 11, wherein:
the main signal line has a first cross sectional area,
the sub signal line has a second cross sectional area other than the first cross sectional area, and
the second cross sectional area is sized to produce the inductance during transmission of the signal which offsets the parasitic capacitance.

13. The printed circuit board assembly of claim 12, wherein:
the first cross sectional area has a first thickness and a first width,
the second cross sectional area has a second thickness and a second width, and
the second width is other than the first width.

14. The printed circuit board assembly of claim 13, wherein the second width is less than the first width.

15. The printed circuit board assembly of claim 13, wherein
the pad has a third thickness and a third width, and
the third width is other than the first and second widths.

16. The printed circuit board assembly of claim 15, wherein the third width is greater than the first and second widths.

17. The printed circuit board assembly of claim 16, wherein the second width is less than the first width.

18. The printed circuit board assembly of claim 11, wherein:
the substrate further comprises at least one layer having a via hole extending through the layer, and
the main signal line connects to the sub signal line such that the signal passes through the via hole.

19. A printed circuit board assembly for use with a surface mounted device (SMD), comprising:
a substrate;
a pad on the substrate and on which the SMD is mountable;
a main signal line on the substrate and having a parasitic capacitance when a signal is transmitted between the main signal line and the pad; and
a sub signal line connecting the main signal line and the pad and through which the signal passes between the main signal line and the pad, the sub signal line being shaped to produce an inductance to offset the parasitic capacitance during transmission of the signal,
wherein the main signal line has a first cross sectional area, the sub signal line has a second cross sectional area other than the first cross sectional area, and the second cross sectional area is sized to produce the inductance during transmission of the signal which offsets the parasitic capacitance,
wherein the pad has a third cross sectional area other than the first and second cross sectional areas, and
wherein the main signal line and the sub signal line comprise a signal line transmitting a high frequency signal and the SMD comprises an AC coupling capacitor.

* * * * *